(12) United States Patent
Peng

(10) Patent No.: US 6,641,674 B2
(45) Date of Patent: Nov. 4, 2003

(54) MOVABLE EVAPORATION DEVICE

(75) Inventor: Kuang-Chung Peng, Taipei (TW)

(73) Assignee: Helix Technology Inc., Hsinchu (TW)

( * ) Notice: Subject to any disclaimer, the term of this patent is extended or adjusted under 35 U.S.C. 154(b) by 0 days.

(21) Appl. No.: 10/160,879

(22) Filed: May 31, 2002

(65) Prior Publication Data

US 2002/0139305 A1 Oct. 3, 2002

Related U.S. Application Data

(63) Continuation-in-part of application No. 09/710,702, filed on Nov. 10, 2000, now abandoned.

(51) Int. Cl.[7] ............................. C23C 16/00; H05H 1/02
(52) U.S. Cl. ................. 118/727; 118/730; 118/723 VE; 118/726; 427/585
(58) Field of Search ................................. 118/727, 730, 118/723 VE, 726, 715, 716, 723 CB, 723 EB, 731; 204/298.28, 298.23, 298.41; 427/592, 585, 587, 593

(56) References Cited

U.S. PATENT DOCUMENTS

| | | | |
|---|---|---|---|
| 4,328,763 A | * | 5/1982 | Sommerkamp et al. ..... 118/727 |
| 5,190,590 A | * | 3/1993 | Suzuki et al. ................ 118/664 |
| 5,288,328 A | * | 2/1994 | Nouvelot et al. ............ 118/722 |
| 5,490,880 A | * | 2/1996 | Kao et al. .................... 118/665 |
| 5,525,158 A | * | 6/1996 | Tsukazaki et al. .... 118/723 CB |
| 6,012,413 A | * | 1/2000 | Tsujimoto et al. .... 118/723 EB |
| 6,082,296 A | * | 7/2000 | Tran ..................... 118/723 EB |
| 6,086,727 A | * | 7/2000 | Pinarbasi ............... 204/192.11 |
| 6,342,103 B1 | * | 1/2002 | Ramsay ..................... 118/726 |

FOREIGN PATENT DOCUMENTS

JP    4-198092 A  *  7/1992 ........... C30B/23/08

* cited by examiner

Primary Examiner—Parviz Hassanzadeh
(74) Attorney, Agent, or Firm—J.C. Patents

(57) ABSTRACT

A movable evaporation device, arranged in an evaporation system. The evaporation system has an evaporation chamber and a vacuum system. The vacuum system is connected to the evaporation chamber externally. The evaporation chamber has a rotatable wafer table to fix and rotate a wafer during thin film deposition. The movable evaporation device has several movable evaporation boats to carry evaporation source. Each of the evaporation boat further includes an evaporation boat and a movable arm. The moving arm is connected to a bottom of the evaporation chamber. The moving arms can rotate from 0° to 360°, and the length of the moving arms are determined by the amount and position of the evaporation boats in the evaporation chamber.

5 Claims, 5 Drawing Sheets

MOVABLE EVAPORATION DEVICE

CROSS-REFERENCE TO RELATED APPLICATION

This application is a continuation-in-part of the prior application Ser. No. 09/710,702, filed Nov. 10, 2000 now abandoned.

BACKGROUND OF THE INVENTION

1. Field of the Invention

The invention relates in general to an evaporation system. More particularly, this invention relates to a moving evaporation device of an evaporation system.

2. Description of the Related Art

The current thin film deposition technique comprises physical vapor deposition and chemical vapor deposition. One of the very popular processes for physical vapor deposition includes evaporation. Via heating the evaporation source, thin film deposition is performed by a saturation vapor tension of the evaporation source at a high temperature in the evaporation process. The deposition of thin film includes a series of atom absorption, surface diffusion of the absorbed atom and agglomeration under proper stage or kink position.

A typical evaporation system comprises a vacuum evaporation chamber for execution vacuum evaporation and an external vacuum system to provided vacuum to the evaporation chamber. The evaporation chamber further comprises an evaporation boat and a rotatable wafer table. The evaporation boat is located at a lower portion inside of the evaporation chamber to carry an evaporation source. The material for making the evaporation boat includes high temperature material. The rotatable wafer table is located at an upper portion inside the evaporation chamber. A wafer or a substrate is fixed on the rotatable wafer table, which is rotating during thin film deposition. When a proper amount of current flows through the evaporation boat, the evaporation source is heated by the heat generated by resistance effect of the evaporation boat. When the evaporation source is heated up to near a melting point, the originally solid evaporation source has thus a very strong evaporating rate. The evaporated particles are then deposited on the wafer located over the evaporation source.

FIGS. 1A to 1D show a conventional evaporation system. In FIG. 1A, the evaporation system 100 comprises an evaporation chamber 102 and a vacuum system 104. The external vacuum system 104 is connected to the evaporation chamber 102 to provide a vacuum environment. The evaporation chamber 102 comprises an evaporation boat 106 and a rotatable wafer table 108. The rotatable wafer table 108 is located at an upper portion inside the evaporation chamber 102 to fix a wafer 110 thereon. To improve the uniformity for thin film deposition, the rotatable wafer table 108 is rotating during deposition. The evaporation boat 106 under the rotatable wafer table 108 is located at a lower portion inside the evaporation chamber 102 to carry an evaporation source 112. When a current flows through the evaporation boat 106, a heat is generated via resistance effect. The solid evaporation source 112 is then heated until reaching a melting point at which the evaporation rate is high. The particles of the evaporation source 112 are then evaporated and deposited on the wafer 110.

FIG. 1B shows a cross sectional view of the evaporation boat as illustrated in FIG. 1A. The evaporation boat 106 is a crucible having a central recess 114 at which the evaporation source 112 is located. The heat generated via resistance effect evaporates the evaporation source 112 for deposition.

FIG. 1C is the cross sectional view of the wafer 110 after being deposited with a thin film, and FIG. 1D shows the evaporation range. In FIG. 1C, after the evaporation process, the wafer 110 comprises a thin film 116 thereon. As mentioned above, to improve the uniformity, the wafer table 108 is rotating during deposition. However, as shown in FIG. 1D, a non-uniform distribution of the thin film 116 still occurs.

Referring to FIG. 1D, the deposition coverage can be partitioned into two regions 118 and 120. During thin film deposition, particles of the evaporated source 112 reach to a central region 118 first, and then diffuse outwardly to the region 120. As a result, more particles are deposited in the central region 118. The deposited particles becomes more and more diluted as the particles diffuse outwardly. The non-uniformity does not only affect the precision of the subsequent process, but also may cause the damage of the wafer.

SUMMARY OF THE INVENTION

The invention provides a movable evaporation device to improve the uniformity of a thin film deposited by evaporation process, so as to reach the requirements for precision and device dimension. The moving rate of the evaporation source is controlled by the evaporation device so as to obtain a uniform thin film. In addition, the distance between the evaporation source and the wafer is adjusted to control the deposition rate.

The movable evaporation device is applied in an evaporation system that comprises an evaporation chamber and a vacuum system. The movable evaporation device is located at a lower portion inside the evaporation chamber, and the vacuum system is external and connected to the evaporation chamber to provide a vacuum environment inside the evaporation chamber. The evaporation chamber further comprises a rotatable wafer table at an upper portion of the evaporation chamber to carry a wafer. The movable evaporation device comprises more than one movable evaporation boat to carry evaporation source. Each movable wafer boat further comprises a wafer boat and a moving arm. The moving arm is connected to a bottom of the evaporation chamber and can make a rotation for 360°. The length of the moving arm is determined by the number and position of the wafer boats.

Both the foregoing general description and the following detailed description are exemplary and explanatory only and are not restrictive of the invention, as claimed.

DESCRIPTION OF THE PREFERRED EMBODIMENTS

Figure 1A:
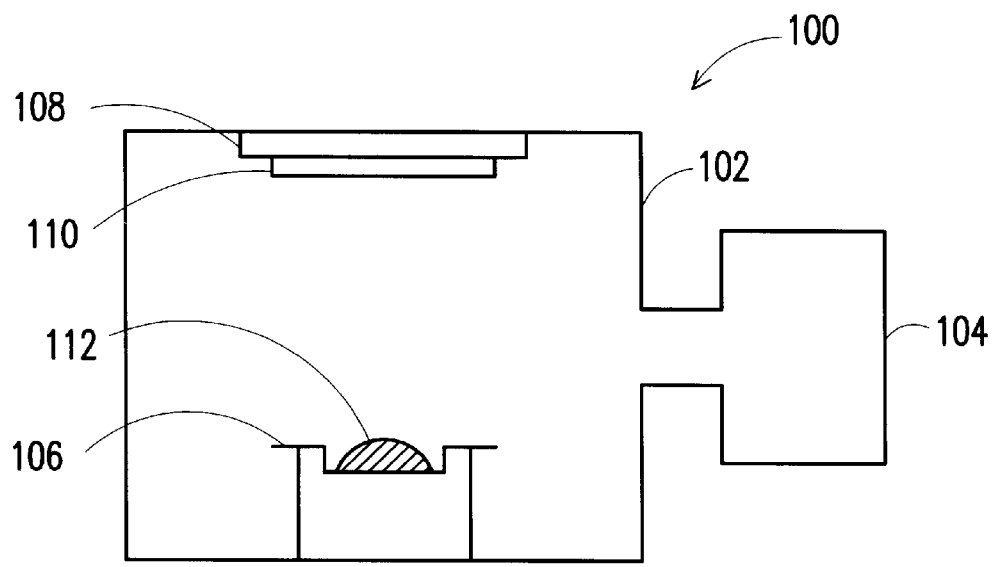
FIG. 1A shows a top view of a conventional evaporation system.
Figure 1B:
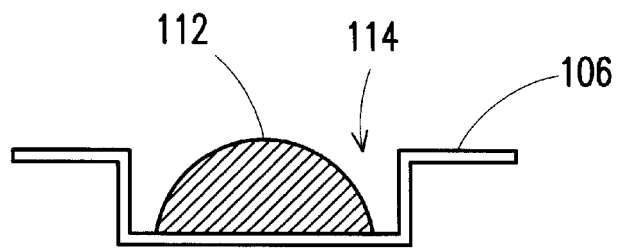
FIG. 1B is a cross sectional view of the evaporation boat as shown in FIG. 1B.
Figure 1C:
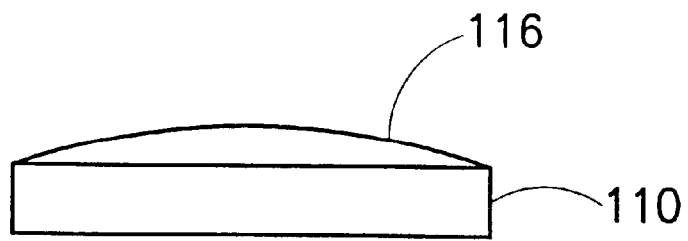
FIGS. 1C and 1D are cross sectional view and the evaporation coverage for the thin film deposited on the wafer.
Figure 1D:
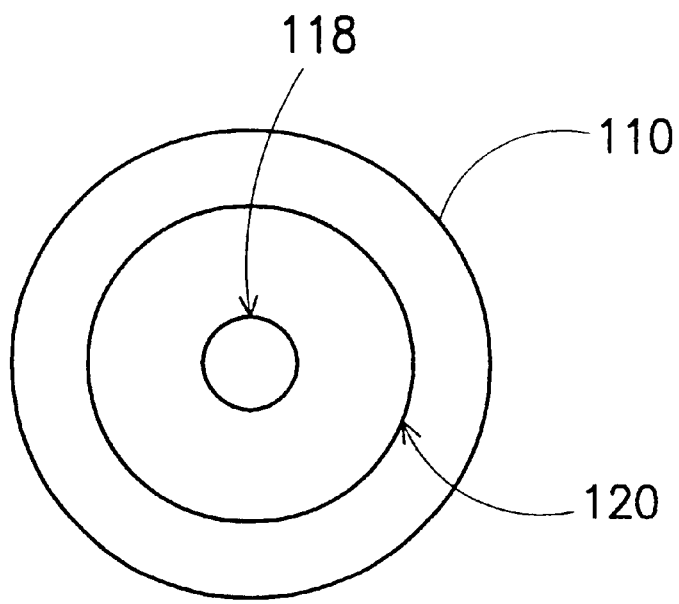
Figure 2A:
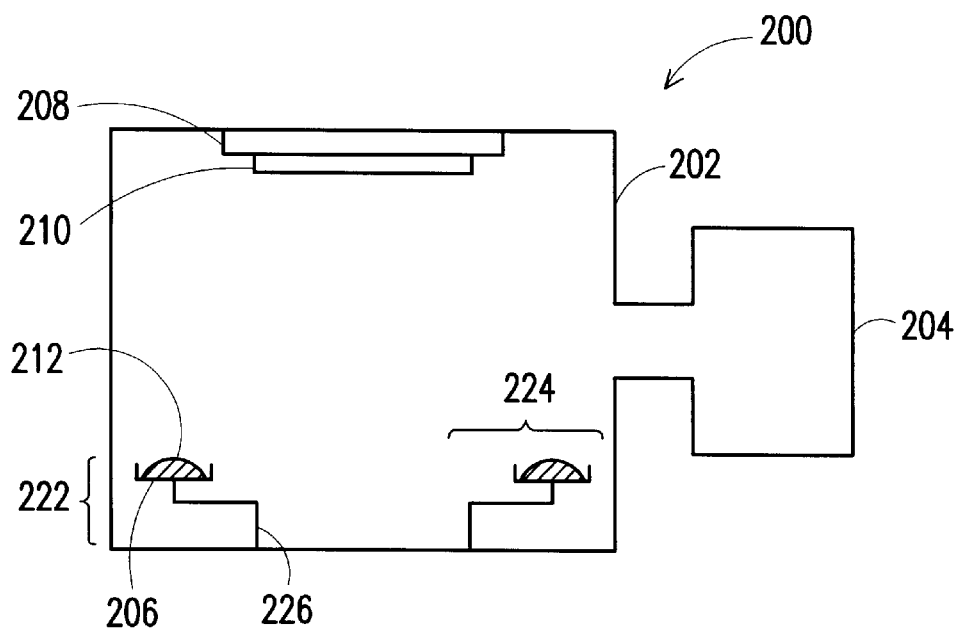
FIG. 2A is a side view of an evaporation system provided by the invention.

In FIG. 2A, the evaporation system 200 comprises an evaporation chamber 202 and a vacuum system 204. The vacuum system 204 is external and connected to the evaporation chamber 202 to provide a vacuum environment inside of the evaporation chamber 202. The evaporation chamber 202 comprises a rotatable wafer table 208 located at an upper portion inside the evaporation chamber 202 to fix and rotate a wafer 210 during thin film deposition. A movable evaporation device 222 is located at a lower portion of the evaporation chamber 202. In this embodiment, the movable evaporation device 222 comprises two movable evaporation boats 224, and each of which comprises an evaporation boat 206 and a moving arm 226. It is appreciated that the movable evaporation device 222 may comprises more than two movable evaporation boats 224 according to specific requirement.

The moving arm 226 has one end connected to the bottom of the evaporation chamber 202, and the other end connected to the evaporation boat 206 to carry and shift the evaporation boat 206 during thin film deposition. When a proper amount of current flows through the evaporation boats 206, the evaporation sources 212 carried within the evaporation boats 206 are heated up to a temperature near the melting point thereof. The previously solid evaporation sources 212 are then evaporated into particles. The evaporated particles are then deposited on the wafer 210. This distribution of the evaporated particles on the wafer 210 can be controlled by moving the movable evaporation device 222, and the deposition rate of these particles can be control by adjusting the distance between the evaporation sources 212 and the wafer 210.

Figure 2B:
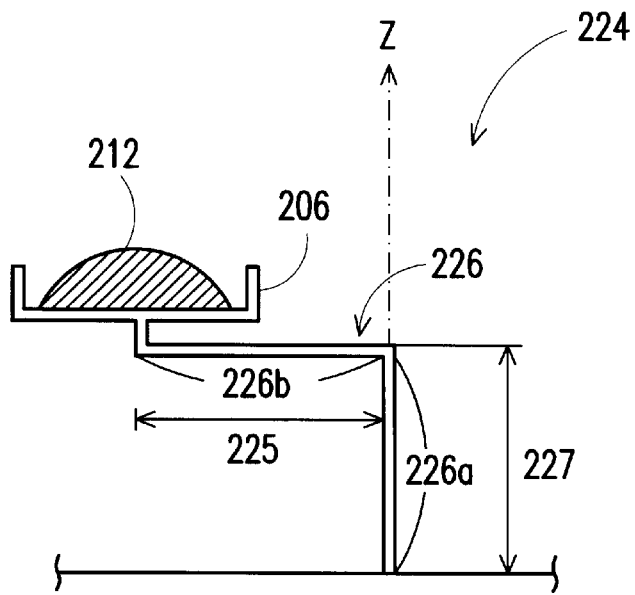
FIG. 2B is a cross sectional view of one of the movable evaporation boats as shown in FIG. 2A.

From FIG. 2B, the simplified structure of the movable evaporation boat 224 is illustrated. The movable evaporation boat 224 comprises an evaporation boat 206 for carrying the evaporation source 212 and the moving arm 226. As mentioned above, the moving arm 226 has one end connected to the bottom of the evaporation chamber 202 and the other end supporting the evaporation boat 206. The moving arm 226 has an upperarm part 226a and a forearm part 226b. Preferably, one end of the upperarm part 226a and one end of the forearm part 226b are jointed to form an L shape. However, other angles, either larger or smaller than 90 degree can be adjusted for the angle between both parts. The bottom end of the upperarm part 226a is vertically connected to the bottom of the evaporation chamber 202. A length 225 of the forearm part 226b and a height 227 of the upperarm part 226a can be adjusted according to the number and position of the wafer boats.

A center of the upperarm part 226a is defined as the Z-axis of rotation, as shown in FIG. 2B. During deposition, the moving arm 226 can rotate about the Z-axis from 0° to 360° to allow a uniform deposition of the thin film. When a current passes through the evaporation boat 206, a heat is generated due to resistance effect. The evaporation source 212 is thus heated and evaporated into particles to be deposited on the wafer 210.

Figure 3:
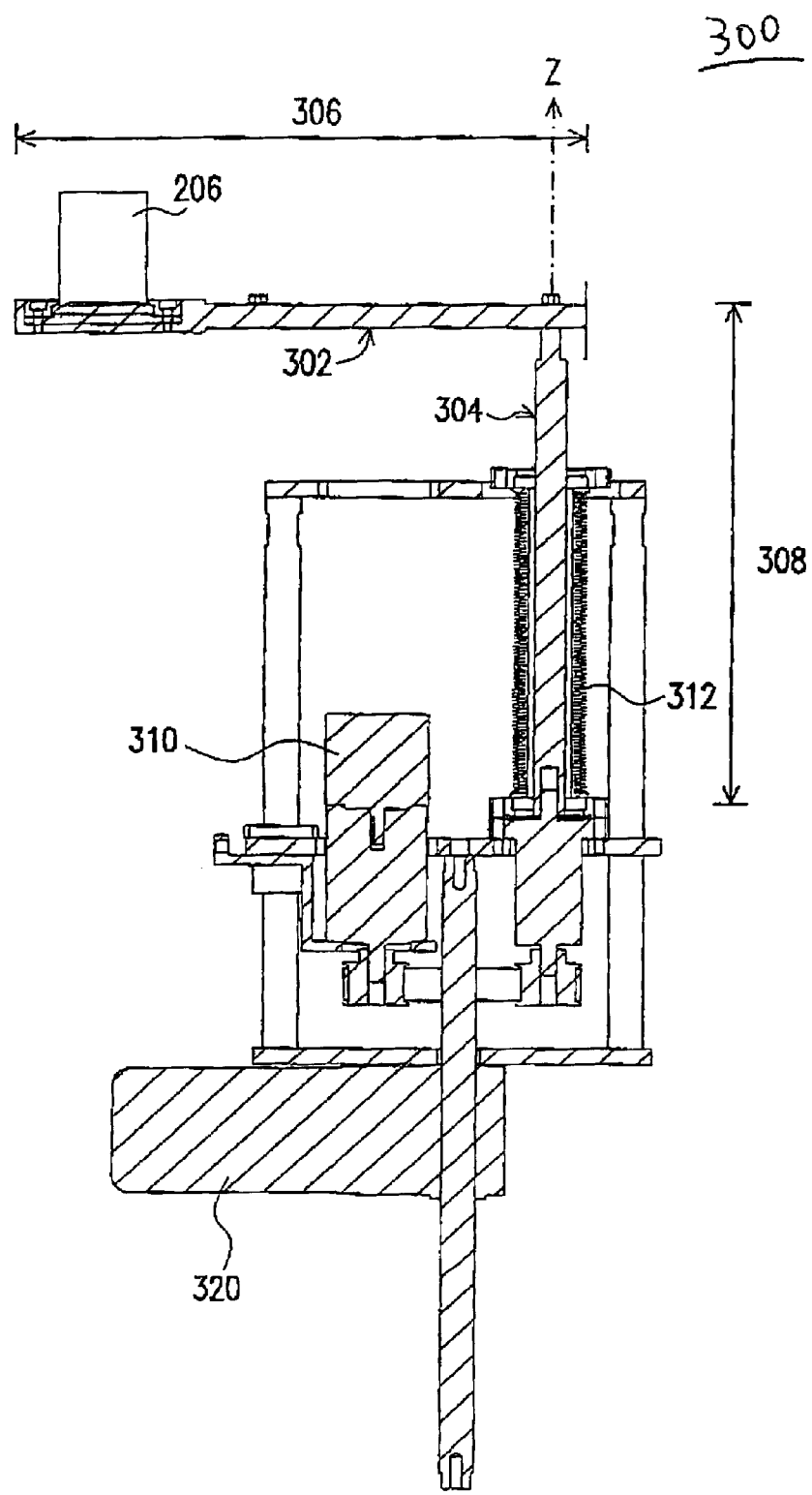
FIG. 3 is a cross sectional view of the moving arm.

Referring to FIG. 3, the structure of the moving arm is shown with more details. The moving arm 300 includes a forearm part 302 and an upperarm part 304 jointed in an L shape to the forearm part 302. The forearm part 302 and the upperarm part 304 are jointed by, for example, a screw. The screw can be used to adjust the angle θ between the forearm part 302 and the upperarm part 304 from 45° to 135°; preferably, the angle θ is 90°. The forearm part 302 has a length 306 ranging from 20–40 cm; preferably, 25–35 cm. The length 306 and the angle θ between the forearm part 302 and the upperarm part 304 can be altered according to the number and position of the wafer boats.

The moving arm 300 further includes a Z-motor 310, a rotation motor 320 and other necessary mechanical mountings (not shown) for housing and installing the Z-motor and the rotation-motor. The Z-motor 310 can raise and lower the upperarm part 304 in the Z-direction for adjusting height through, for example, a bellows 312. The upperarm part 304 has a height 308 ranging from 20–40 cm; preferably, 25–35 cm, while the height 308 can be rectified for varying the distance between the evaporation source and the wafer. The activation of the rotation-motor 320 causes the rotation of the upperarm part 304 about the Z-axis. The rotation angle ranges from 0° to 360°, as long as no possible hitting toward other moving arms occurs. The moving arm 300 can rotate either at a regular speed or at a varying speed depending on the uniformity requirements of the wafer.

The design of the Z-motor and the rotation-motor is not described in full details herein, since other possible designs available to people skilled in this field can be employed.

Figure 2C:
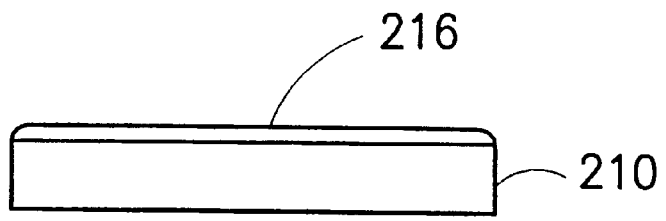
FIG. 2C is a cross sectional view of the thin film deposited on the wafer in the evaporation system as shown in FIG. 2A.
Figure 2D:
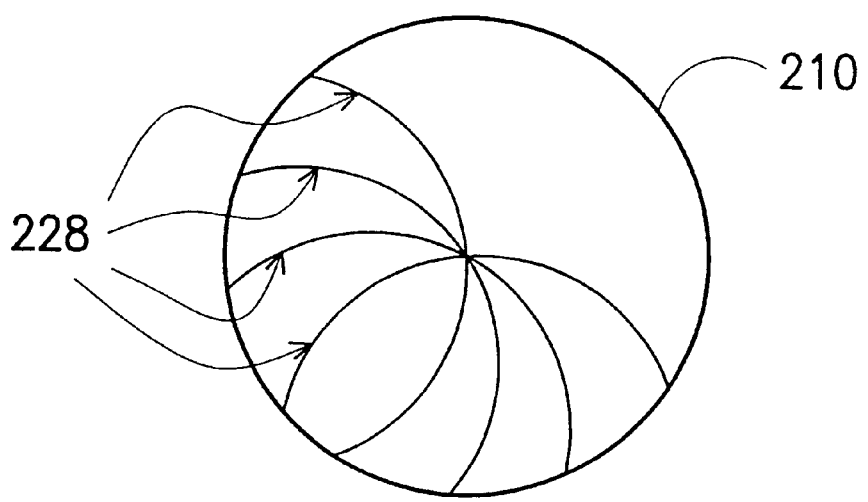
FIG. 2D shows a trace of the thin film deposition.

In FIG. 2C, after the evaporation process, a thin film 216 is deposited on the wafer with a uniform distribution. In FIG. 2D, the deposition trace 228 of the thin film 216 is illustrated. As the deposition trace 228 is the distribution of evaporated particles resulted by the rotation of the wafer 210 along with the rotatable wafer table 208, and rotation of the evaporation source 212 along with the moving arm 226. As a result, the evaporated particles are distributed on the wafer 210 evenly to form a uniform thin film.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A movable evaporation device arranged in an evaporation system comprising an evaporation chamber and an external vacuum system connected to the evaporation chamber, wherein the evaporation chamber further comprises a rotatable wafer table to carry a wafer at an upper portion of the evaporation chamber, the device comprises a plurality of movable evaporation boats at a lower portion of the evaporation chamber, wherein each of the movable evaporation boats further comprises an evaporation boat and a moving arm with one end connected to a bottom of the evaporation chamber, and the other end supporting the evaporation boat, wherein the moving arm further comprises a forearm part and an upperarm part jointed in an L shape to the forearm part, and the forearm part is connected to the evaporation boat, while the upperarm part is connected the bottom of the evaporation chamber, wherein a central longitudinal axis of the upperarm part is used as a rotation axis, so that the moving arm and the evaporation boat rotate about the rotation axis.

2. The device according to claim 1, wherein the rotatable wafer table is used to fix the wafer thereon and rotate during thin film deposition.

3. The device according to claim 1, wherein the moving arm and the evaporation boat rotate about the rotation axis from 0° to 360°.

4. The device according to claim 1, wherein a length of the forearm part of the moving arm is determined by the number and position of the movable evaporation boats.

5. The device according to claim 1, wherein the evaporation boats carry evaporation source.

* * * * *